(12) United States Patent
Suciu et al.

(10) Patent No.: US 11,352,031 B2
(45) Date of Patent: Jun. 7, 2022

(54) WAYSIDE FRICTION MANAGEMENT SYSTEM

(71) Applicant: L.B. Foster Rail Technologies Canada Ltd., Pointe-Claire (CA)

(72) Inventors: Stefan Alexandru Suciu, Laval (CA); Mark Wylie, St. Laurent (CA); Petar Gueorguiev, Pointe Claire (CA)

(73) Assignee: L B Foster Rail Technologies Canada Ltd, Pointe-Claire (CA)

( * ) Notice: Subject to any disclaimer, the term of this patent is extended or adjusted under 35 U.S.C. 154(b) by 227 days.

(21) Appl. No.: 16/349,590

(22) PCT Filed: Nov. 10, 2017

(86) PCT No.: PCT/CA2017/051351
§ 371 (c)(1),
(2) Date: May 13, 2019

(87) PCT Pub. No.: WO2018/085943
PCT Pub. Date: May 17, 2018

(65) Prior Publication Data
US 2019/0276058 A1  Sep. 12, 2019

Related U.S. Application Data

(60) Provisional application No. 62/421,732, filed on Nov. 14, 2016.

(51) Int. Cl.
*B61K 3/00* (2006.01)
*G01R 19/25* (2006.01)
*B61C 15/08* (2006.01)

(52) U.S. Cl.
CPC ............. *B61K 3/00* (2013.01); *B61C 15/085* (2013.01); *G01R 19/25* (2013.01)

(58) Field of Classification Search
None
See application file for complete search history.

(56) References Cited

U.S. PATENT DOCUMENTS

| 5,492,642 A | 2/1996 | Mulvihill et al. |
| 5,641,037 A | 6/1997 | Wise et al. |

(Continued)

FOREIGN PATENT DOCUMENTS

| CA | 2 321 507 A1 | 3/2002 |
| EP | 1 357 175 A1 | 10/2003 |

(Continued)

OTHER PUBLICATIONS

Zhang S. et al., "Train Detection by Magnetic Field Sensing", Sensors and Materials, vol. 25, No. 6, pp. 423-436, Aug. 2013.
(Continued)

*Primary Examiner* — Daniel C Puentes
(74) *Attorney, Agent, or Firm* — Paul D Bangor, Jr.; Clark Hill PLC

(57) ABSTRACT

A wayside friction management system, and method for monitoring and controlling a wayside friction management system is described. The system comprises one or more wayside device for mounting on a track of a rail system and configured to apply, through a delivery system, a friction control media onto a track. The wayside device further comprises one or more data collection module configured to collect and transmit data to a remote performance unit. The transmitted data is compared to reference values, and adjustments are made to the friction control media dispensing parameters, for example pump time, as required per the comparison. The data at least comprises measurements of the internal voltage of the delivery system. The wayside device may comprise a power source operatively connected to one or more components of the wayside device.

16 Claims, 8 Drawing Sheets

(56) References Cited

U.S. PATENT DOCUMENTS

| | | |
|---|---|---|
| 6,136,757 A | 10/2000 | Chiddick |
| 6,387,854 B1 | 5/2002 | Sedelmeier et al. |
| 6,719,095 B2 | 4/2004 | Arens et al. |
| 6,759,372 B2 | 7/2004 | Cotter |
| 6,795,372 B2 | 9/2004 | Kim et al. |
| 6,854,563 B2 | 2/2005 | Kumar et al. |
| 6,855,673 B2 | 2/2005 | Cotter et al. |
| 7,045,489 B2 | 5/2006 | Cotter et al. |
| 7,160,378 B2 | 1/2007 | Eadie et al. |
| 7,244,695 B2 | 7/2007 | Eadie |
| 7,357,427 B2 | 4/2008 | Eadie et al. |
| 7,481,400 B2 | 1/2009 | Appleby et al. |
| 7,939,476 B2 | 5/2011 | Eadie et al. |
| 2004/0038831 A1 | 2/2004 | Eadie |
| 2008/0203735 A1 | 8/2008 | Leslie |
| 2015/0211680 A1* | 7/2015 | Conley ................ F16K 31/508 251/129.11 |
| 2016/0257319 A1 | 9/2016 | Appleby et al. |

FOREIGN PATENT DOCUMENTS

| | | | |
|---|---|---|---|
| EP | 1 418 222 A2 | 5/2004 | |
| GB | 2 405 910 A | 3/2005 | |
| GB | 2405910 A * | 3/2005 | ............. F16N 13/20 |
| WO | WO 98/13445 A1 | 4/1998 | |
| WO | WO 02/25919 A1 | 3/2002 | |
| WO | WO 03/106240 A1 | 12/2003 | |
| WO | WO 2011/143765 A1 | 11/2011 | |
| WO | WO 2013/067628 A1 | 5/2013 | |

OTHER PUBLICATIONS

International Search Report and Written Opinion in International Application No. PCT/CA2017/051351, dated Feb. 12, 2018.

* cited by examiner

WAYSIDE FRICTION MANAGEMENT SYSTEM

CROSS REFERENCE TO RELATED APPLICATIONS

This patent application is a United States National Stage Application filed under 35 U.S.C. § 371 of International Application No. PCT/CA2017/051351, entitled "WAYSIDE FRICTION MANAGEMENT SYSTEM," which was filed on Nov. 10, 2017, which claims the benefit of U.S. Provisional Patent Application Ser. No. 62/421,732 filed on Nov. 14, 2016, the disclosures of each are hereby incorporated by reference in their entireties.

FIELD OF INVENTION

The present invention relates to a wayside friction management system. The present invention also relates to the use of sensor feedback and performance analysis for the control and adjustment of wayside friction management systems in rail operations.

BACKGROUND OF THE INVENTION

Wayside friction management application systems, including gauge face lubrication systems and top of rail (TOR) friction modifier application systems, are used to optimize rail system performance and reduce lateral (track spreading) loads or curving forces, derailment probability, rail and wheel wear, energy consumption, fuel consumption, initiation and propagation of rolling contact fatigue, noise and corrugations in railroad operations. TOR friction modifier materials or lubricants commonly used for this purpose include water based liquids that establish a dry thin film at the wheel/rail interface once the water has evaporated. Examples of such friction modifying materials may include, but are not limited to those disclosed in U.S. Pat. Nos. 6,136,757, 6,855,673, 6,759,372, 7,939,467, 7,244,695, 7,160,378, 7,045,489, WO 02/26919 (which are herein incorporated by reference).

WO 2013/067628 (which is incorporated herein by reference) describes a method for optimizing track performance that involves analysis of track status data and data obtained from a territory and from maintenance conditions and adjusting an operating parameter, a track parameter or both, to optimize track performance (for example by lowering lateral/vertical forces, modulating geometry of the track, modulating superelevation of the track, modulating lubrication status of the track, modulating train operating speed, modulating distributed power of the train, or a combination thereof).

WO2011/143765 (which is incorporated herein by reference) discloses a wayside friction management system for application of a friction control media to a track. The system includes a data collection module that collects and transmits data to a remote performance unit (RPU). The RPU compares the obtained data with base line reference values and determines how much of the friction control media is to be applied to the track to achieve target lateral force levels.

TOR friction control effectiveness may be adversely affected by inadvertent dispensation of inappropriate quantities of friction modifier materials or lubrication onto the tracks, for example insufficient friction modifier materials or lubrication application. Insufficient application of friction modifier materials or lubricant on the tracks may result from variations in system hardware components, changes in ambient conditions that lead to less friction modifying dispensation, or combinations thereof. It is desirable to account for the potential effects of key variables that impact the delivery of friction control media or lubricants onto a track surface.

SUMMARY OF THE INVENTION

The present invention relates to a wayside friction management system. The present invention also relates to the use of sensor feedback and performance analysis for the control and adjustment of wayside friction management systems in rail operations.

Described herein is a wayside friction management system comprising:

a. one or more wayside device for mounting with a track of a rail system and for applying a friction control media to the track, the one or more wayside device comprising a delivery system connected via a hose to a reservoir containing the friction control media, the delivery system for dispensing the friction control media to one or both rails of the track via a pump;

b. one or more data collection module located at or adjacent to the delivery system, the one or more data collection module in operative communication with the delivery system, one or more data collection sensors, or a combination thereof;

c. a remote performance unit (RPU); and d. a power source operatively connected to one or more components of the wayside friction management system;

the one or more data collection module configured to collect data and transmit the data to the RPU, the data comprising real time measurements of an internal voltage of the delivery system, the pump, or a combination thereof. The RPU comprising reference values stored on a database thereon, the reference values comprising one or more reference voltage values, the RPU configured to compare the data to the reference values, wherein at least the real time measurements of the internal voltage are compared to at least the one or more reference voltage values, and depending on a difference between the data and the reference values, a friction control media delivery time of the pump is modified in order to achieve a desired quantity of the friction control media to the track.

Furthermore, the one or more reference voltage values may comprise historical measurements of the internal voltage of the delivery system corresponding to unadjusted friction control media output quantities, or the one or more reference voltage values may comprise preset voltage values that are input by a user or an operator of the wayside friction management system, the preset voltage values corresponding to unadjusted friction control media output quantities.

Also provided herein is the wayside friction management system as described above, wherein the data collected by the one or more data collection module further comprises measurements of ambient temperature, wetness of the track, head space pressure of the reservoir, reservoir tank level, pump input pressure, pump output pressure, pump motor current, fluctuations in the internal voltage of the wayside delivery system, fluctuations in the internal voltage of the pump, time pump is delivering friction control media, delivery hose pressure, delivery hose temperature, battery voltage, ambient temperature and humidity, precipitation, wind, wetness or the track, time since last train pass, number of axels or wheels passing the one or more wayside device, data collected from a video unit, data collected from a photo capture unit, data collected from an acoustic feedback unit, data collected from a vibration detection unit, data collected from a speed detection unit, data collected from a strain gauge, and data collected from an accelerometer, or a combination thereof.

The reference voltage values of the wayside friction management system described above may further comprise initial settings that are inputted into the database by a user or operator of the wayside friction management system, the initial settings comprising type of friction control media being delivered, physical characteristics of the friction control media, physical characteristics of the hose, characteristics related to manufacturing variability in the pump, speed of pump gear rotation, characteristics related to manufacturing variability in the hose, physical characteristics of the reservoir, or any combination thereof. For example, the physical characteristics of the hose may comprise hose material, hose length or a combination thereof.

Also provided herein is the wayside friction management system described above, that comprises a plurality of the one or more wayside device distributed over a designated geographical territory, the RPU configured to receive the data from each of the one or more data collection modules distributed within the designated geographical territory. The wayside friction management system may further comprise a plurality of the designated geographical territories, each of the designated geographical territories comprising one or more of the one or more wayside device.

Each of the one or more wayside device as described above may further comprise a receiver configured to receive instructions from the RPU, and convey the instructions to the delivery system.

Also described herein is a method of controlling friction control media output of the wayside friction management system as described above, the method comprising:
  i) collecting the data;
  ii) transmitting the data by radio frequency, cellular communications channels, or both, from the one or more wayside device to the remote performance unit;
  iii) comparing the data with the reference values; and
  iv) depending on a difference between the data and the reference values, modifying the friction control media delivery time of the pump in order to achieve, or maintain, delivery of the desired quantity of the friction control media to the track.

Also described herein is a remote performance unit (RPU) configured to receive data from one or more wayside device, the data comprising real time measurements of an internal voltage of a delivery system, a pump, or a combination thereof, the RPU comprising reference values stored on a database thereon, the reference values comprising one or more reference voltage values, the RPU configured to compare the data to the reference values, wherein at least the real time measurements of the internal voltage are compared to at least the one or more reference voltage values, and depending on a difference between the data and the reference values, a friction control media delivery time of the pump is modified in order to achieve delivery of a desired quantity of the friction control media to a track of a rail system.

The remote performance unit as just described may comprise one or more software algorithms for analyzing the data and providing an output of track performance, track status, status of the one or more wayside device, information of an environment of the track, information of a train, or a combination thereof.

The RPU may also analyze data comprising measurements of ambient temperature, wetness of the track, head space pressure of the reservoir, reservoir tank level, pump input pressure, pump output pressure, pump motor current, fluctuations in the internal voltage of the wayside delivery system, fluctuations in the internal voltage of the pump, time pump is delivering friction control media, delivery hose pressure, delivery hose temperature, battery voltage, ambient temperature and humidity, precipitation, wind, wetness of the track, time since last train pass, number of axels or wheels passing the one or more wayside device, data collected from a video unit, data collected from a photo capture unit, data collected from an acoustic feedback unit, data collected from a vibration detection unit, data collected from a speed detection unit, data collected from a strain gauge, and data collected from an accelerometer, or a combination thereof.

The reference values of the remote performance unit may comprise initial settings that are inputted into the database by a user or operator of the wayside friction management system, the initial settings comprising type of friction control media being delivered, physical characteristics of the friction control media, physical characteristics of the hose, characteristics related to manufacturing variability in the pump, speed of pump gear rotation, characteristics related to manufacturing variability in the hose, physical characteristics of the reservoir, or any combination thereof.

The remote performance unit may also comprise a transmitter to convey instructions by radio frequency, cellular communication channels, or both, to a receiver in communication with the one or more wayside device.

Also described herein is a wayside friction management system comprising:
  (a) one or more wayside device for mounting on a track of a rail system and for applying a friction control media to the track, the one or more wayside device comprising a delivery system connected via a hose to a reservoir containing the friction control media, the delivery system for dispensing the friction control media to one or both rails of the track via a pump;
  (b) one or more data collection module in operative communication with the delivery system, one or more data collection sensors, or a combination thereof;
  (c) a remote performance unit (RPU); and
  (d) a power source operatively connected to one or more components of the wayside friction management system;
  the one or more data collection module configured to collect data and transmit the data to the RPU, the data comprising real time measurements of time since last train pass, axel or wheel pass number, or both the time since last train pass, and the axel or wheel pass number,
  the RPU comprising reference values stored on a database thereon, the reference values comprising one or more reference values of the time since last train pass, the axel or the wheel pass number, or both, the RPU configured to compare the data to the reference values, wherein at least the real time measurements time since the last train pass, the axel or the wheel pass number or both, are compared to at least the one or more reference time since the last train pass, the axel or the wheel pass number, or both, and depending on a difference between the data and the reference values, a friction control media delivery time of the pump is modified to achieve a desired quantity of the friction control media on the track.

The one or more data collection module wayside friction management system described above may further be configured to collect data and transmit the data to the RPU, the data comprising real time measurements of an internal voltage of the delivery system, the pump, or a combination thereof, and the RPU comprising reference values stored on a database thereon, the reference values comprising one or more reference voltage values, the RPU configured to compare the data to the reference values, wherein at least the real time measurements of the internal voltage are compared to at least the one or more reference voltage values, and depending on a difference between the data and the reference values, a friction control media delivery time of the pump is modified to achieve a desired quantity of the friction control media on the track.

The reference values of the remote performance unit may comprise initial settings that are inputted into the database by a user or operator of the wayside friction management system, the initial settings comprising type of friction control media being delivered, physical characteristics of the friction control media, physical characteristics of the hose, characteristics related to manufacturing variability in the pump, speed of pump gear rotation, characteristics related to manufacturing variability in the hose, physical characteristics of the reservoir, or any combination thereof.

The remote performance unit may also comprise a transmitter to convey instructions by radio frequency, cellular communication channels, or both, to a receiver in communication with the one or more wayside device.

This summary of the invention does not necessarily describe all features of the invention.

BRIEF DESCRIPTION OF THE DRAWINGS

These and other features of the present disclosure will become more apparent from the following description in which reference is made to the appended drawings:

FIG. 1A shows the general information flow of the wayside friction management system of the present disclosure. FIG. 1B shows the general components of a wayside device including the friction management application system of FIG. 1A.

DETAILED DESCRIPTION

Directional terms such as "top," "bottom," "upwards," "downwards," "vertically," and "laterally" are used in the following description for the purpose of providing relative reference only, and are not intended to suggest any limitations on how any article is to be positioned during use, or to be mounted in an assembly or relative to an environment. The use of the word "a" or "an" when used herein in conjunction with the term "comprising" may mean "one," but it is also consistent with the meaning of "one or more," "at least one" and "one or more than one." Any element expressed in the singular form also encompasses its plural form. Any element expressed in the plural form also encompasses its singular form. The term "plurality" as used herein means more than one, for example, two or more, three or more, four or more, and the like.

As used herein, the terms "comprising," "having," "including" and "containing," and grammatical variations thereof, are inclusive or open-ended and do not exclude additional, un-recited elements and/or method steps. The term "consisting essentially of" when used herein in connection with a composition, use or method, denotes that additional elements, method steps or both additional elements and method steps may be present, but that these additions do not materially affect the manner in which the recited composition, method or use functions. The term "consisting of" when used herein in connection with a composition, use or method, excludes the presence of additional elements and/or method steps.

As used herein, the term "about", when used to describe a recited value, means within 10% of the recited value.

The present disclosure relates to a wayside friction management system. The present disclosure also relates to the use of sensor feedback and performance analysis for the control and adjustment of wayside friction management systems in rail operations. A wayside friction management system is required to dispense friction control media onto a target location of a track, in an appropriate quantity, at an appropriate time, and in the appropriate conditions. Such dispensation is at least in part influenced by an analysis of: (i) collected data pertaining to track conditions, system conditions, environmental conditions, initial settings, or a combination thereof; against (ii) corresponding reference values, including user inputted parameters that are stored in the wayside friction management system.

Non-limiting examples of wayside friction management systems that may use the invention as described herein, are described in WO 2011/143765, GB 2,405,910, U.S. Pat.

Nos. 5,641,037, 6,719,095, 6,854,563, US 2008/0203735, WO2003/106240 (each of which is incorporated herein by reference).

Figure 1A:
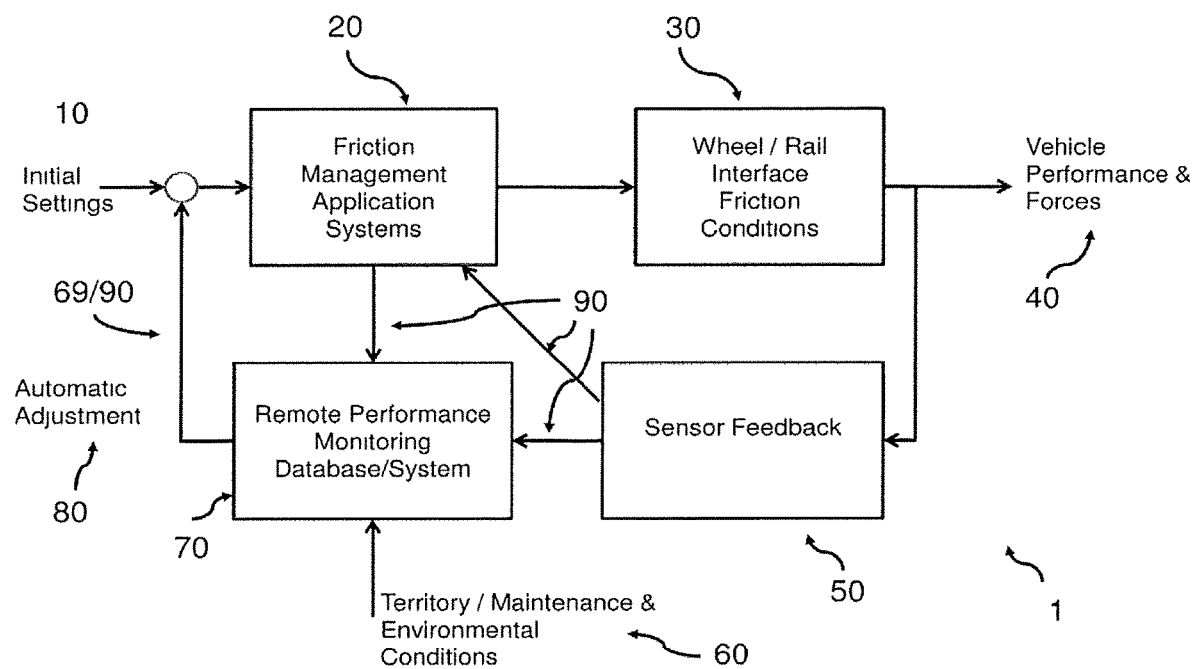
FIGS. 1A and 1B show prior art block diagram representations of the flow of information and control actions in determining system performance and territory conditions and adjusting outputs, in accordance with an embodiment of the present disclosure.
Figure 1B:
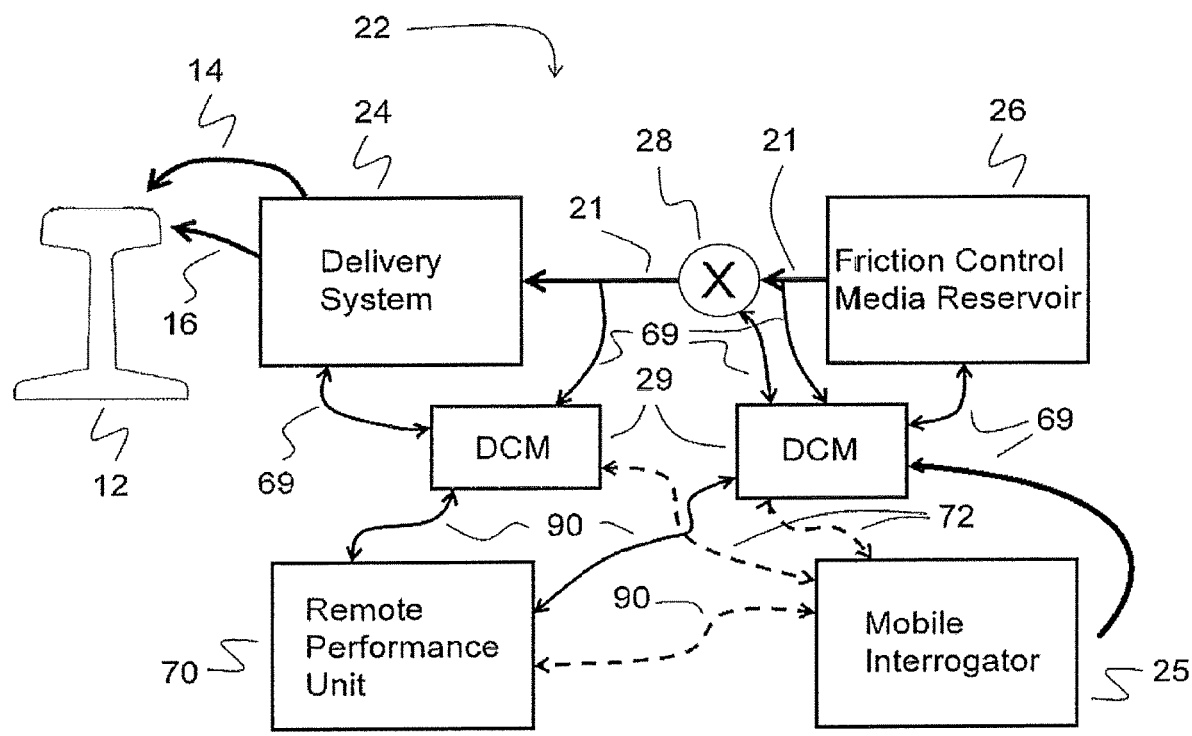

With reference to FIGS. 1A and 1B, there is provided a general example of a prior art wayside friction management system 1 (as described in WO2011/143765 which is incorporated herein by reference). In this example, the wayside friction management system 1 comprises one or more than one friction management application systems 20, each friction management application system 20 comprising one or more than one wayside device 22 (see FIG. 1B) mounted alongside a track 12 of a rail system. FIG. 1B also shows how the one or more than one wayside device interacts with a Remote Performance Unit (70; RPU) and a Mobile Interrogator (25). The one or more than one wayside device 22 is used to apply a friction control media onto the track 12 and obtain data 50, from the track 30, the environment of the track 40, ambient environmental conditions 60, or a combination thereof.

Each wayside device 22 comprises a delivery system 24 connected to a reservoir 26 containing the friction control media, via one or more hoses 21. The delivery system 24 is located adjacent a track 12 to be treated so that the friction control media may be applied to one or both rails of the track 12. The wayside delivery device 22 further comprises a pump 28 that is positioned at a suitable location within the delivery system to provide the friction control media to the track or wheels of a passing rail car. The pump 28 may be a gear pump, a positive displacement gear pump, a diaphragm pump, a peristaltic pump or any suitable pump as is known in the art.

The one or more than one wayside delivery devices 22 apply friction control media into the wheel/rail interface, thereby providing means to achieve, or maintain, appropriate levels of friction, or friction co-efficient, between the wheel of the train and rail surfaces. Application of friction control media into the wheel/rail interface includes, but is not limited to: (i) applying friction control media to a gauge face 16, top of rail 14, or both, as a paste, a liquid, or a spray to be picked up by direct contact with passing wheels of a train; (ii) spraying friction control media onto the gauge face 16, top of rail 14, or both, of the track 12; or (iii) spraying friction control media onto the flanges or treads of passing wheels of the train.

The one or more than one wayside devices 22 located within the one or more than one friction management application systems 20 are typically positioned immediately preceding a location where application of friction control media is required. The passage of the train wheels spreads the friction control media over an area of the track 12 so as to modify the friction on the rail sections and wheel treads and flanges within that area of the track 12 as the train passes. One or more sensors, for example, but not limited to, wheel sensors (for example U.S. Pat. No. 7,481,400), mechanical switches, axel counters, railwheel proximity sensors, load sensors, optical/video sensors, accelerometers, strain gauges, noise/sound sensors, light imaging, detection and ranging (LIDAR; also termed LiDAR), ultrasonic sensors, RADAR, magnetic sensors (Zhang S., et al., 2013, Sensors Materials 25: 423-436), or a combination thereof, that indicate when a train is passing through the location of the wayside delivery device may be used to determine the duration of time during which the friction control media is delivered to the track. There are several designs of stationary devices and apparatus for securing the wayside devices 22 so as to permit an automatic application or dispensation by the delivery system 24 of friction control media to the rail when the train passes. These designs and apparatuses include, but are not limited to, a depression of the roadbed that triggers a dispensation of a friction control media, tripping of a mechanical device (e.g. a lever or a plunger) by the train's wheels that activates the friction control media dispensing mechanism. Other sensors may also be used to activate the friction control media dispensing mechanism, for example, but not limited to, a wheel sensor device (e.g. a sensor device that is based on magnetic activation, for example U.S. Pat. No. 7,481,400), mechanical switches, axel or wheel counters, railwheel proximity sensors, load sensors, optical/video sensors, accelerometers, strain gauges, noise/sound sensors, light imaging, detection and ranging (LIDAR; also termed LiDAR), ultrasonic sensors, RADAR, magnetic sensors (Zhang S., et al., 2013, Sensors Materials 25: 423-436), or other means known in the art. In this manner, the wayside delivery system 24 may be activated mechanically, hydraulically, or electrically. Any type of wayside device 22 may be used with the invention as described herein. Non-limiting examples of such prior art wayside devices are shown in U.S. Pat. No. 5,641,037, WO 2011/143765, GB 2,405,910, U.S. Pat. Nos. 6,719,095, 6,854,563, US 2008/0203735, WO2003/106240 (each of which is incorporated herein by reference).

The one or more than one wayside devices 22 may each further comprise one or more than one data collection module 29 (DCM; FIG. 1B) that may be located at or adjacent to the delivery system 24, or that may be located away from, but in operative connection (for example via, wire, cable, wireless, radio communication, or a combination thereof) with, the delivery system 22. The one or more than one data collection module 29 collects data (for example, but not limited to data 29, 69, 90), and transmits the data by wire, cable, wirelessly, or a combination thereof to a processor or system controller, for example a remote performance unit 70 located off-site from where the wayside device 22 is located. Sensors that collect the data may also transmit the data by wire, cable, wirelessly, or a combination thereof to the data collection module 29. Wireless transmissions may be, but are not limited to, transmissions via radio frequency, cellular communications channels, for example general packet radio service.

The data collected and transmitted by the one or more data collection modules 29 comprise information pertaining to the performance and status of the wayside delivery system 24, performance information of the track 50 (e.g. information acquired by sensors located near or at the track), track status information 60 including for example, territory/maintenance and environmental conditions, track environment information, information of a train passing over the track 40 (e.g. train performance and force), ambient environmental conditions, or any combination thereof. For example, which is not to be considered limiting, the data collected by the one or more data collection module 29 may include one or more of: lateral/vertical force measurements, lateral force measurements, incoming vertical load data, rail lateral or vertical deflection, gauge width, locomotive position data, auto equipment identification, one or more measurements of reservoir tank level, headspace pressure within the reservoir, pump input pressure, pump output pressure, pump motor current, fluctuations in the internal voltage of the wayside delivery system 24, fluctuations in the internal voltage of the pump 28, time pump 28 is delivering friction control media, volumetric compensation arising from manufacturing variability in system hardware components (motor, pump, hoses etc.), speed of pump gear rotation, delivery hose 21 pressure, delivery hose 21 temperature, the type of delivery hose 21, the length of the delivery hose 21, battery voltage, ambient temperature and humidity, type of friction control media being delivered, precipitation, wind, wetness of the track, time since last train pass, number of wheels passing the one or more than one wayside devices 22 and data collected from at least any one of a video unit, a photo capture unit, an acoustic feedback unit, a vibration detection unit, a speed detection unit, a strain gauge, and an accelerometer, or any combination thereof. Additional sensors known to a person skilled in the art may also be used.

One or more than one friction application systems 20, each comprising one or more than one wayside device 22, may be distributed over a designated geographical territory. In this manner, the remote performance unit (RPU) 70 receives data from one or more data collection modules 29 distributed within the designated geographical territory. The remote performance unit 70 may also obtain data from a plurality of the designated geographical territories, each of the designated geographical territory comprising the one or more wayside device 22 and data collection modules 29. Therefore, the wayside friction management system 1 may include one or more designated geographical territories, and one or more data sampling locations. For simplicity, the systems described herein pertain to one or more wayside device 22 within a friction management application system 20 communicating with a remote performance unit 70. However, the present invention also contemplates the use of a plurality of friction management application systems 20 located within one or more designated geographical territories.

The wayside device 22 may comprise a power source operatively connected to one or more components of the wayside device 22, for example, to the pump 28, to the delivery system 24, to the data communications module 29, or any combination thereof.

Initially, a benchmark friction control media quantity may be dispensed onto the track 12 at a preset pump rate and a preset pump time (i.e. initial settings, 10). The benchmark friction control media quantity is typically a quantity, volume, or weight, of friction control media that provides an appropriate level of friction, or friction co-efficient, between the track and the train wheels. The pump time is the duration of time the pump is actively delivering friction control media to the track. The benchmark friction control media quantity may depend on the length of time since the last train pass by the one or more than one wayside devices 22 as determined by an axel or wheel counter. For example, if there is no traffic for more than a pre-determined period of time, for example, but not limited to more than 1-10 hours, for example, 3 hours, the unit may not apply friction control media to the track because the first pump cycle may result in increasing the pressure in the hose to an operational level. If the system has been inactive for a longer period of time, for example 10 or more hours, the hose longer than a predetermined length, for example greater than 7 m, or both (i.e. a long period of inactivity and a long hose length), then several wheel passes may be required to achieve the pressure required in the hose in order to apply the friction control media onto the track. Thus, an axel or wheel counter may trigger a "system boost" or "system primer" to increase the pump rate, the pump time or both the pump rate and the pump time by about 1 to about 100% or any amount therebetween, for example about 1 to about 30%, from the preset pump rate and/or time for a pre-determined period of time, for example, from 0.25 to about 2 seconds, or any amount therebetween, or number of wheel passes, for example from 1 to about 25 wheel passes, or any number therebetween. The change in pump time may be set on the control box of the friction management application system 20, for example from information received from the remote performance unit (RPU; 70). In addition or alternatively, the pump rate, pump time or both pump rate and pump time may be adjusted up or down (i.e. to increase or decrease the pump output) based on whether the friction control media is delivered to the track at the beginning of the train pass, the middle portion of the train or the end of the train, based on data from the axel or wheel counter sensor. For example, remote performance unit 70 may be programmed so that friction control media is pumped onto the track after a preset number of wheel passes, for example friction control media may be pumped onto the track after every 2 to 500, or any amount therebetween, wheel passes (as determined using the wheel counter sensor). If it is desired that the system pump at the first wheel and then after a middle wheel, the remote performance unit 70 may programmed to pump following passage of the first wheel and then pump after passage of a predetermined wheel pass number. Thus, friction control media application may be shifted relative to wheel location on the train.

During the application of the benchmark friction control media, the conditions of the track, the train, the weather, and the delivery system may be determined. Changes in one or more variables associated with the wayside friction management system 1, for example but not limited to the reservoir tank level, headspace pressure within the reservoir, pump input pressure, pump output pressure, pump motor current, change in the speed of rotation of the pump gear wheel, changes in the internal voltage of the wayside delivery system 24, changes in the internal voltage of the pump 28, the time pump 28 is delivering friction control media, the volume or weight of friction control media output, volumetric compensation arising from manufacturing variability in system hardware components (motor, pump, hoses etc.), delivery hose 21 pressure, delivery hose 21 temperature, the type of delivery hose 21, the length of the delivery hose 21, the battery voltage, the ambient temperature and humidity, type of friction control media being delivered, the precipitation, rain and wetness of the track, time since the last train pass, number of wheels passing the one or more than one wayside devices 22, data collected from a video unit, a photo capture unit, an acoustic feedback unit, or any combination thereof, may be used to increase or decrease the rate, the amount, or both the rate and the amount of the dispensation of friction control media onto the track 12. For example, and as explained above, if a train has not passed the one or more than one wayside devices 22 for more than a pre-determined period of time, for example, but not limited to more than 1-10 hours, the rate, the amount, or both the rate and the amount of the dispensation of friction control media may be increased. In addition, or alternatively, after a certain number of wheels have passed the one or more than one wayside devices 22, the rate, the amount, or both the rate and the amount of the dispensation of friction control media may be adjusted, for example decreased or increased, as required. For example, after a number of applications of the friction control media to the track, a saturation point may be reached after which further applications of the friction control media results in limited improvement to the wheel-rail interaction. Thus, after a certain number of wheel passes as determined by a wheel or axel counter, for example, from about 24 to about 500, or any amount therebetween, wheel passes, or more, the application of the friction control media may be decreased by an amount of 1 to 30%, or any amount therebetween, or stopped entirely, particularly for long trains and tracks with high traffic frequency.

As an additional example, changes to the internal voltage of the motor (pump motor) may increase or decrease the rate, volume, weight, or a combination thereof, of the dispensation of friction control media, and result in an increase or decrease in the amount of friction control media delivered to the track surface, when compared to either a pre-set, target friction control media quantity, rate, volume or weight, or the benchmark friction control media quantity, rate, volume or weight. In order to compensate for changes that result in a change in the pump rate, volume, weight, or a combination thereof, of the friction control media applied onto the track, the duration that the pump delivers the friction control media may need to be adjusted to achieve an appropriate co-efficient of friction between the rail track and wheels of the train.

Figure 3A:
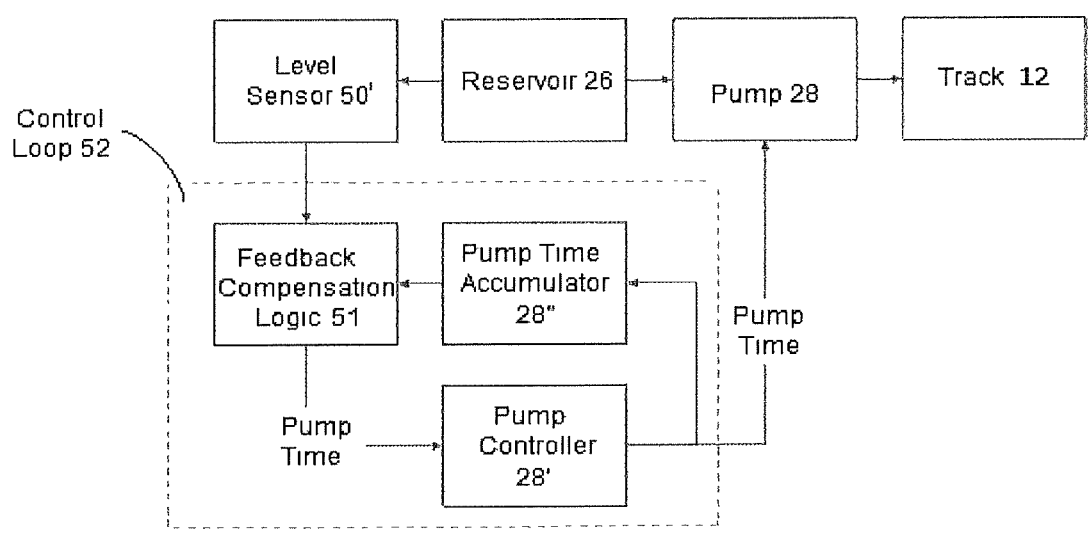
FIG. 3A shows a logic diagram for compensating friction control media level variability in a reservoir, the variability being due at least in part to manufacturing variability in the system pump, motor, or hoses, the aging of hardware components of the system, or any combination thereof.
Figure 3B:
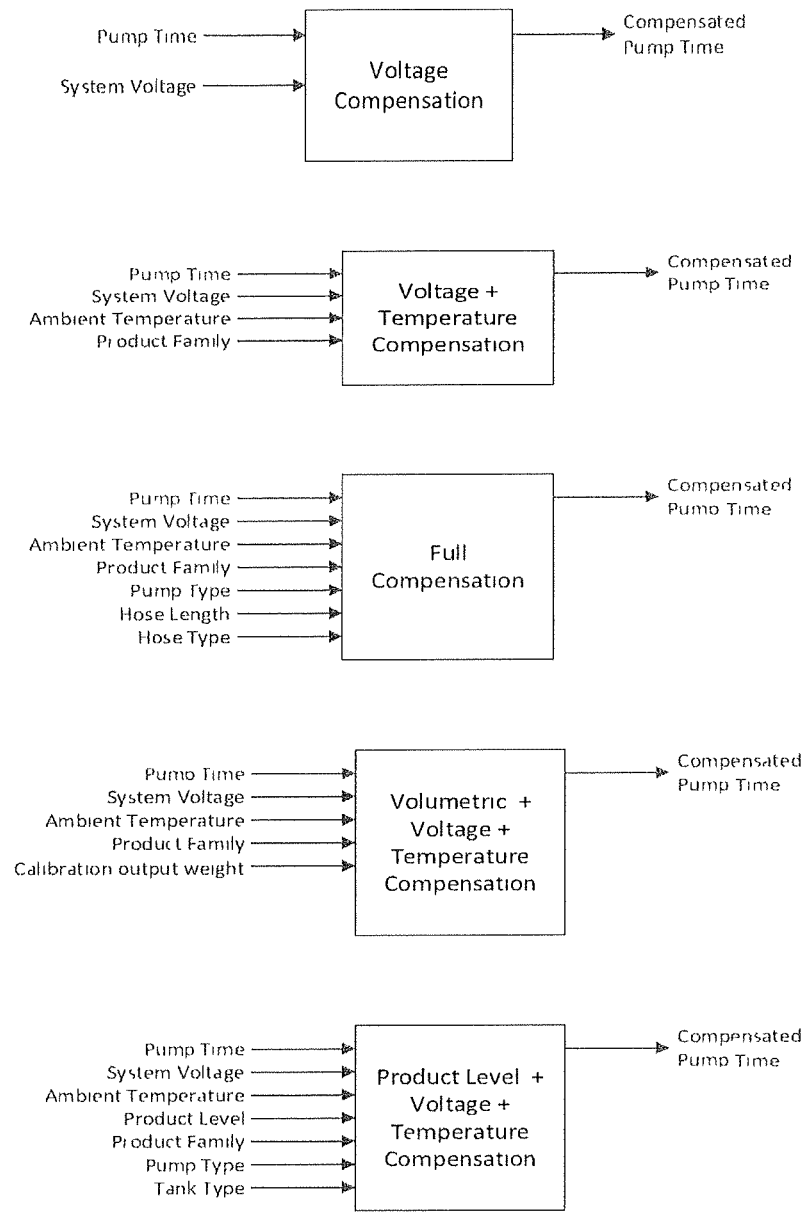
FIG. 3B shows examples of five systems as described herein that result in producing a compensated pump time. For each example, "system voltage", "ambient temperature", "product level" and "rain" (if measured) are obtained using sensors and may be considered variable inputs, and "product family", pump type", "tank type" (reservoir type) may be considered fixed inputs that are entered into the system by the user.

The pump time (i.e. the time the pump is delivering friction control media to the track) may be adjusted by taking into consideration data pertaining to the measured internal voltage of the delivery system 24 by itself or in combination with one or more variables of ambient temperature, track wetness, headspace pressure within the reservoir 26, the characteristics of the friction control media, the pump type, friction control media level compensation, tank type, the hose length, the hose type, and any volumetric compensation that may arise from variability in system hardware components (see FIG. 3B). For example, the pump time may be adjusted by taking into account data of the measured pump time and:

(i) data pertaining to measured system voltage (Voltage Compensation) as obtained by sensors; the output (Compensated Pump Time) is dynamically compensated based on the system voltage variation; data pertaining to rain or humidity levels may also be considered;

(ii) data pertaining to measured system voltage, ambient temperature as obtained by sensors, and information related to the inherent characteristics of the friction control media (e.g. calibrated output weight, viscosity, water content, solids content; oil content etc.) as input by the user (Voltage+Temperature Compensation); the output (Compensated Pump Time) is dynamically compensated based on the system voltage and temperature variation; data pertaining to rain or humidity levels may also be considered;

(iii) data pertaining to measured system voltage, ambient temperature as obtained by sensors, and information related to the inherent characteristics of the friction control media (for example a calibrated output weight), pump type, hose length and hose type as input by user (Full Compensation); the output (Compensated Pump Time) is adjusted by fixed parameters based on the pump type, hose length, and hose type, and dynamically compensated based on the system voltage and temperature variation (depending upon the product family); data pertaining to rain or humidity levels may also be considered;

(iv) data pertaining to measured system voltage, ambient temperature as obtained by sensors, and information related to the inherent characteristics of the friction control media (product family) and the output weight of the friction control media as input by the user (Volumetric+Voltage+Temperature Compensation); the output (Compensated Pump Time) is adjusted by fixed parameters based on calibration output weight, and dynamically compensated based on the system voltage, and temperature (depending on product family); data pertaining to rain or humidity levels may also be considered;

(v) data pertaining to measured system voltage, ambient temperature as obtained by sensors, information related to the inherent characteristics of the friction control media (product family), friction control media level, pump type, hose type, hose length, and tank (reservoir) type (Product Level+Volumetric+Voltage+Temperature Compensation); the output (Compensated Pump Time) is adjusted by fixed parameters based on the pump type, hose length, and hose type, and dynamically compensated based on the system voltage, temperature (depending on product family), and a correction factor determined by feedback compensation (see FIG. 3A; described in more detail below). The product level with the tank type is used by the feedback compensation algorithm to determine the actual product output. The Pump type is used to set an initial condition for the algorithm; data pertaining to rain or humidity levels may also be considered;

(vi) data pertaining to measured system voltage in combination with any other variable described herein, for example, but not limited to volumetric compensation arising from manufacturing variability in system hardware components (motor, pump, hoses etc.), rotation rate of pump gear, head pressure within the reservoir, output pressure of friction control media leaving pump (pump output pressure), input pressure of friction control media coming into the pump (pump input pressure), or (vii) a combination of any of (i) to (vi).

By taking into account variables that may affect the performance of the wayside delivery system 24, and the effect of these variables on the amount, volume, weight, or a combination thereof, of the friction control media delivered to the track, the pump time may be adjusted ("compensated pump time", FIG. 3B) so that an appropriate quantity of friction control media may be dispensed onto the track 12.

Data may be collected (sampled) and transmitted, during the interval of time that the train is passing the wayside device, or at intervals when there is no train passing the wayside device (i.e. to determine the status check of the delivery system), by the one or more data collection module 29 on a continuous basis, or sampled at intervals. For example, when a train is passing by the wayside device, data may be collected at intervals of from about 0.05 sec to 10 minutes, or any amount therebetween, for example, when a train is passing by the wayside device, data may be collected at intervals of from about 0.05 to 1.95 sec, or any amount therebetween, for example data may be sampled at intervals from about 0.05, 0.06, 0.07, 0.08, 0.09, 0.1, 0.11, 0.12, 0.13, 0.14, 0.15, 0.16, 0.17, 0.18, 0.19, 0.2, 0.25, 0.3, 0.35, 0.4, 0.45, 0.5, 0.55, 0.6, 0.65, 0.7, 0.75, 0.8, 0.85, 0.9, 0.95, 1.0, 1.05, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, 2.0, 2.5, 3.0, 3.5, 4.0, 4.5, 5.0, 5.5, 6.0, 6.5, 7.0, 7.5, 8.0, 8.5, 9.0, 9.5, 10.0, 15.0, 20.0, 30.0, 40.0, 50.0, 60.0 sec, or the data may be collected at intervals from about 1, 1.5, 2, 2.5, 3, 3.5, 4, 4.5, 5, 5.5, 6, 6.5, 7, 7.5, 8, 8.5, 9, 9.5, 10 minutes, or any amount therebetween. If it is desired to determine status of the wayside device when a train is not present at the wayside device, then data may be sampled by the one or more data collection module at intervals from about 1 min to 24 hours.

The collected data (for example, but not limited to data 29, 69, 90) may be transmitted by wire, cable, wirelessly, or a combination thereof, to a processor or system controller, for example a remote performance unit 70 located off-site from where the wayside device 22 is located. Data may be transmitted to the remote performance unit 70 at regular intervals, for example, the collected data may be transmitted at intervals from about 1 min to about 24 hours. For example, collected data may be transmitted every 3 to 10 min, or any time therebetween, collected data may be transmitted every 3 to 60 min, or any time therebetween, collected data may be transmitted every 1, 2, 3, 5, 10, 15, 20, 25, 30, 35, 40, 45, 50, 55, 60 min, or any amount therebetween, or every 1, 2, 4, 6, 8, 10, 12, 14, 16, 18, 20, 22, 24 hours, or any amount therebetween.

The present disclosure also provides a method of monitoring a wayside friction management system. The method involves using sensors to collect data measured at one or more than one data collection module 29 located at one or more than one data collection location and comparing the collected data with base line reference values, or initial settings 10, stored on a database of a processing unit, or control system, for example, a remote performance monitoring unit 70, or a processing unit located within the data collection module 29. The data collection location may be located, or may not be located, at the same place as one or more than one wayside device 22. The data may be transmitted by wire, cable, radio frequency, cellular communications channels, or a combination thereof, from sensors that collect the data and to the data collection module 29, the measured data may be transmitted by wire, cable, radio frequency, cellular communications channels, or a combination thereof, from the data collection module 29 to a processor, control system, or remote performance monitoring unit 70 or an equivalent processor for further analysis. The transmitted data is then compared with base line reference values or initial settings 10 stored on a database of the processor, or remote performance monitoring unit 70, recent values obtained from the same one or more than one data collection module 29 at the data collection location stored on a database of the processor or remote performance monitoring unit, or a combination thereof. Base line reference values or initial settings 10 include, but are not limited to, information pertaining to properties of the friction control media, hose type, hose length, hose material, pump type, tank type, and calibration inputs, as well as reference voltage measurements of the internal voltage of the pump, internal voltage of the wayside delivery system 24. Additional baseline reference values may also be obtained for: the reservoir tank level, headspace pressure within the reservoir, pump input pressure, pump output pressure, pump motor current, change in the speed of rotation of the pump gear wheel, the time pump 28 is delivering friction control media, the volume or weight of friction control media output, volumetric compensation arising from manufacturing variability in system hardware components (motor, pump, hoses etc.), delivery hose 21 pressure, delivery hose 21 temperature, the type of delivery hose 21, the battery voltage, the ambient temperature and humidity, the precipitation, rain and wetness of the track, time since the last train pass, number of wheels passing the one or more than one wayside devices 22, data collected from a video unit, a photo capture unit, or an acoustic feedback unit, or any combination thereof.

The data collection location may be the same as that of the friction application system or site comprising the wayside device 22, or the data collection location may be located at a distance from the friction application system or site. If the one or more data collection sites are located at a distance from the friction application site, then the data collection sites may be considered stand-alone measurement locations that communicate with the database of the central remote performance monitoring unit 70 via wire, cable, a mobile radio-frequency interrogator 25, GPRS 90, radio frequency, cellular communications channels and the like. The data collected from these stand-alone data collection locations, for example using a data collection module 29, may be evaluated by the remote performance unit 70 to determine the performance of nearby friction application systems 20, for example one or more wayside devices within a defined region. The area of a defined region would be apparent to one of skill in the art. Based on the analysis performed by the remote performance unit 70, changes in settings for the one or more than one wayside device 22 located at a distance from the data collection site, but within the defined region, may be transmitted to the one or more than one wayside devices 22.

In the method of monitoring a wayside friction management system, the data may be collected (sampled) and transmitted by the one or more data collection module 29 on a continuous basis, or sampled at intervals. For example, when a train is passing by the wayside device, data may be collected at intervals of from about 0.05 sec to 10 minutes, or any amount therebetween, for example, when a train is passing by the wayside device, data may be collected at intervals of from about 0.05 to 1.95 sec, or any amount therebetween, for example data may be sampled at intervals from about 0.05, 0.06, 0.07, 0.08, 0.09, 0.1, 0.11, 0.12, 0.13, 0.14, 0.15, 0.16, 0.17, 0.18, 0.19, 0.2, 0.25, 0.3, 0.35, 0.4, 0.45, 0.5, 0.55, 0.6, 0.65, 0.7, 0.75, 0.8, 0.85, 0.9, 0.95, 1.0, 1.05, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, 2.0, 2.5, 3.0, 3.5, 4.0, 4.5, 5.0, 5.5, 6.0, 6.5, 7.0, 7.5, 8.0, 8.5, 9.0, 9.5, 10.0, 15.0, 20.0, 30.0, 40.0, 50.0, 60.0 sec, or the data may be collected and transmitted at intervals from about 1, 1.5, 2, 2.5, 3, 3.5, 4, 4.5, 5, 5.5, 6, 6.5, 7, 7.5, 8, 8.5, 9, 9.5, 10 minutes, or any amount therebetween. If it is desired to determine status of the wayside device when a train is not present at the wayside device, then data may be sampled by the one or more data collection module at intervals from about 1 min to 24 hours, for example, data may be sampled and transmitted at intervals from about 1, 2, 3, 5, 10, 15, 20, 25, 30, 35, 40, 45, 50, 55, 60 min, or any amount therebetween, or from about 1, 2, 4, 6, 8, 10, 12, 14, 16, 18, 20, 22, 24 hours, or any amount therebetween. Furthermore, the collected data may be transmitted to the remote performance unit 70 at regular intervals, for example, the collected data may be transmitted at intervals from about 1 min to about 24 hours. For example, collected data may be transmitted every 3 to 10 min, or any time therebetween, collected data may be transmitted every 3 to 60 min, or any time therebetween, collected data may be transmitted every 1, 2, 3, 5, 10, 15, 20, 25, 30, 35, 40, 45, 50, 55, 60 min, or any amount therebetween, or every 1, 2, 4, 6, 8, 10, 12, 14, 16, 18, 20, 22, 24 hours, or any amount therebetween.

As provided above, changes in variables of the wayside management system 1 that are not user or operator controlled including, but not limited to, the internal voltage of the wayside delivery system 24, internal voltage of the pump, speed of rotation of pump gear wheel, ambient temperature, hose pressure, hose temperature, ambient humidity, and wetness of the track, may affect the quantity of the friction control media that is dispensed by the wayside delivery system 24 onto the tracks 12.

Figure 2:
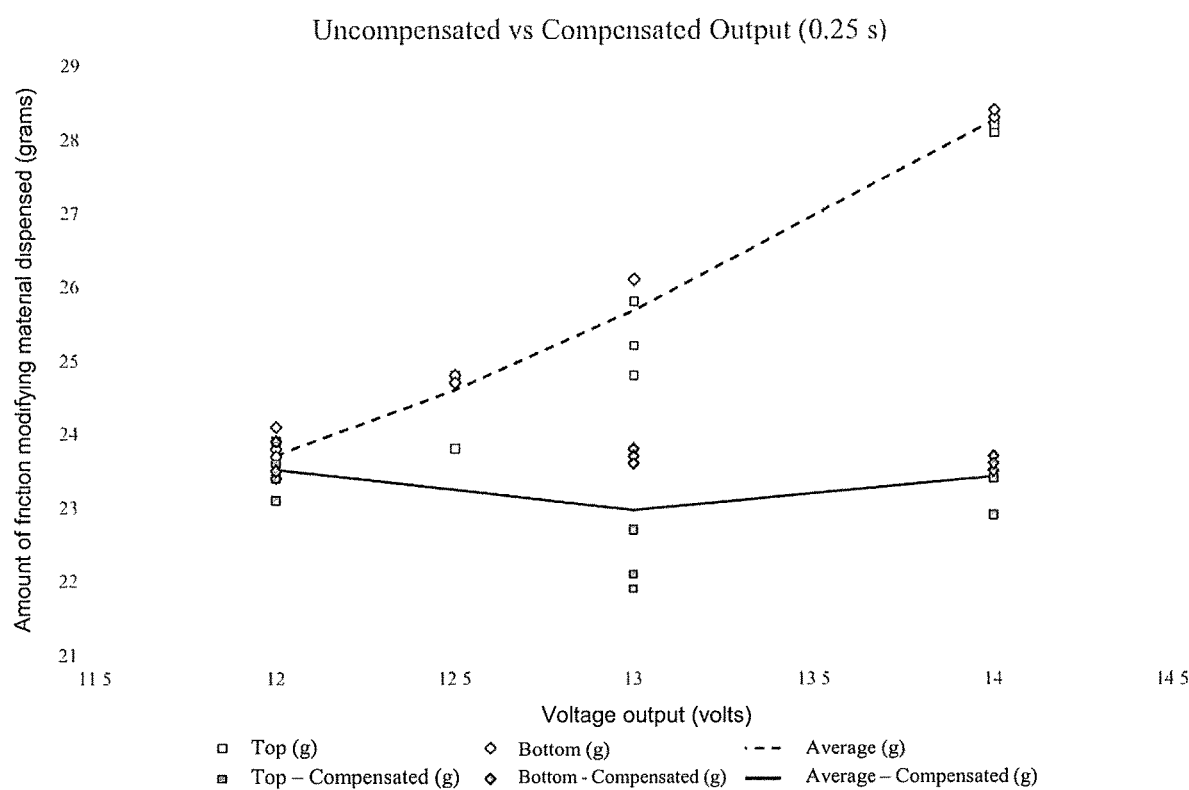
FIG. 2 shows a graph plotting the amount of friction control media delivered by a pump operating at various voltage levels where the variability in the voltage is uncompensated (solid line) or compensated (dashed line).

Referring to FIG. 2, changes in the internal voltage of a wayside delivery system 24 owing to, for example, local increased loads on the electrical grid, or other operational factors may vary the motor speed of the pump 28 and lead to a change in rate that the pump dispenses friction control media onto the tracks 12 (e.g. solid line FIG. 2). In order to compensate (dashed line, FIG. 2) for the effects of such increases or decreases in pump output amount, volume, weight or a combination thereof, data relating to the internal voltage of the wayside delivery system 24 and real-time pump rates are collected by the one or more than one data collection module 29 (Voltage compensation).

Collected voltage measurement data, pump rates or a combination thereof, are relayed to the remote performance unit 70 and compared against the reference voltage values, pump rates, and the unadjusted friction control media dispensation quantities associated with those reference voltage values, pump rates or a combination thereof. The reference voltage values, pump rates, and associated information are stored in a database on the remote performance unit 70. From the comparison of the collected data with the reference data, the preset pump time of the pump 28 may be adjusted or modified to account for any changes in measured system internal voltage and the pump rate compensated as required (see Equation 1 below). The adjusted or compensated pump rate is then relayed from the remote performance unit 70 to the data collection module 29, and the pump 28 rate of the wayside devices 22 is compensated accordingly (see FIG. 3B "Voltage Compensation"). As shown in FIG. 2, by adjusting the pump rate in response to a change in voltage delivered to the pump, a constant amount of friction modifying media may be dispensed by the pump (dashed line) to achieve an appropriate co-efficient of friction between the rail track and the wheels of the train.

The reference voltage values and unadjusted friction control media dispensation quantities associated with the reference voltage values may be based on historical or experimentally derived voltage values. The historical or experimental voltage values correspond to associated and known friction control media output quantities. Alternatively, the reference voltage values may be based on preset voltage values that are inputted by a user or an operator of the wayside friction management system 1. The preset voltage values correspond to associated and known friction control media output quantities.

The effect of internal voltage fluctuations on friction control media dispensation within a wayside delivery system 24 may be compensated for according to Equation 1 (Voltage compensation) below:

$$P_{tc}=P_t*(c_1*V+c_0) \quad \text{(Eq. 1)};$$

where:
"$P_{tc}$" is the compensated pump time,
"$P_t$" is the preset pump time,
"$c_1$" and "$c_0$" are coefficients determined through experimentation, and
"V" is the delivery system voltage.

System voltage is a dynamic factor obtained via sensors, and this factor may be used in each of the various compensation protocols outlined herein, for example, as outlined in FIG. 3B, or in combination with other factors for use in other compensation protocols as desired.

Water, being a natural lubricant, may also affect the co-efficient of friction between the wheel and rail, and therefore affect the amount of friction control media required to be dispensed onto the track 12 (Rain compensation). The wayside device 22 is provided with one or more sensors to detect the presence of water (rain), humidity or both, at or near the tracks 12. In the absence of rain or other variables, friction control media may be dispensed onto the track 12 at the preset pump rate and preset pump time. However, in the presence of rain, increased humidity, or both, the dispensation of friction control media may require adjustments in order to maintain appropriate co-efficient of friction between the rail track and the wheel of the train. If water (rain) is detected in the track 12 environment, then the pump time is adjusted (compensated) using Equation 1.1 (Rain compensation). The amount of friction control media that is dispensed on the track 12 is proportional to a coefficient that is either manually controlled by an operator of the wayside management system 1 or determined according to experimental data collected for different environmental scenarios.

$$P_{tc} = \begin{Bmatrix} P_t; \text{Not Raining} \\ P_t c_1; \text{Raining} \end{Bmatrix}; \quad \text{(Eq. 1.1)}$$

where:
$P_{tc}$ is the compensated Pump Time
$P_t$ is the pump Time
$C_1$ is a coefficient determined experimentally or configured by user.

Rain is a dynamic factor obtained via sensors, and this factor may be used in each of the various compensation protocols outlined herein, for example, as outlined in FIG. 3B, or in combination with other factors for use in other compensation protocols as desired.

Changes in ambient temperature may also affect the flow rate and the amount of friction control media dispensed onto the track 12 (Temperature compensation). Changes in ambient temperature may also affect the volume of product within the reservoir 26. The one or more than one data collection module 29 monitors the ambient temperature and relays the collected data to the remote performance monitoring unit 70. The collected ambient temperature readings are compared against reference temperature readings and the preset pump time of the pump 28 is adjusted as required. For example, an increase in the viscosity of the friction control media, or a decrease in the head pressure within the reservoir 26, may require that the pump time be lengthened in order to dispense a target quantity of friction control media from the reservoir 26 to achieve, or maintain, an appropriate co-efficient of friction between rail track and the wheels of the train. Changes in ambient temperature and their effect on friction control media dispensation may be compensated for according to Equation 2 (Temperature compensation) below:

$$P_{tc}=P_t*(c_3T^3+c_2T^2+c_1T+c_0) \quad \text{(Eq. 2)};$$

where:
"$P_{tc}$" is compensated pump time,
"$P_t$" is the preset pump time,
"T" is temperature, and
"$c_0, c_1, c_2, c_3$" are coefficients determined through experimentation.

The coefficients ($c_0, c_1, c_2, c_3$ etc.) vary depending on the family of friction control media used. Information pertaining to each family of friction control media (product family) used may be manually recorded into the storage database of the remote performance unit 70 and may form a part of the initial settings 10.

System voltage, and temperature are dynamic factors obtained via sensors, and these factors may be used in the "Voltage+Temperature Compensation", "Full Compensation", "Volumetric+Voltage+Temperature Compensation", and "Product level+Voltage+Temperature Compensation", protocols outlined in FIG. 3B. If desired, temperature compensation may combined with other factors for use in other compensation protocols.

In addition to changes in ambient temperatures affecting the volume of the friction control media, the effects of manufacturing variability in the hardware components of the wayside delivery system 24 such as, but not limited to, variations in tolerances between various pumps, pump type, pump motors, hose type, hose lengths, different rates of wear of the pump components, rate of wear of hoses, and the like, non-optimal quantities of friction control media may be dispensed as a result of changes in friction control media volume in the reservoir 26 (Product level compensation). To compensate for such variability, the reservoir 26 levels are monitored and compared to a theoretical product consumption data stored on the database of the remote performance monitoring unit 70. The preset pump time is then linearly scaled to compensate for system variability based on changes in the level of the friction control media within the reservoir, when compared with the expected level of the friction control media within the reservoir based on the theoretical product consumption rate.

Referring to FIG. 3A, a sensor 50' is used to monitor friction control media volume in the reservoir 26. The collected measurements are processed within a control loop 52, using a feedback compensation logic 51 that compares the collected measurements to theoretical product consumption data stored on a database. The collected data may be relayed via the data collection module to a remote performance monitoring unit 70 for processing, the data may be processed by a data collection module 29, or the data may be processed using a processor located elsewhere on-site. A compensated pump rate may be established based on the comparison, and a signal relayed to a pump controller 28' to control the pump time of the pump 28. The pump 28 is activated, and the friction control media is removed from the reservoir 26 and dispensed onto the track 12. The instructions sent to the pump are also captured by the feedback compensation logic 51, through a pump time accumulator 28" for storage as base reference values on the database of the processor, for example the remote performance monitoring unit 70. The pump time accumulator 28", is an internal storage area, for example a counter of the previous pump time, and includes all adjustments that have been made or that are required.

Friction control media level within the tank (reservoir) is a dynamic factor obtained by sensor. This factor may be used in the "Product Level+Voltage+Temperature Compensation" protocol outlined in FIG. 3B, or combined with other factors for use in other compensation protocols as desired.

The expansion and contraction of friction control media in the reservoir 26 may also lead to changes in the headspace pressure in the reservoir 26 (Head pressure compensation). For example, if the volume of friction control media within the reservoir expands and the level of media in the tank is higher, this may result in a greater pressure on the pump 28, and result in more friction control media being dispensed by the pump. In order to account for such volumetric changes in the friction control media in the reservoir 26, a sensor such as, but not limited to, an ultrasonic sensor, to determine the product level within the reservoir, a pressure transducer, to determine the input pressure at the pump, or other sensors known in the art may be used. Additionally, the pressure detected by the pressure sensor may be used to determine the product level within the reservoir. A look-up-table or polynomial function (for example, Equation 3) may then be used to predict the change in flow rate based on pressure and the output is scaled accordingly. Changes in the volume of friction control media and their effect on friction control media dispensation may be compensated for, according to Equation 3 (Head pressure compensation) below:

$$P_{tc}=P_t*F(P) \tag{Eq. 3};$$

where:
"$P_{tc}$" is compensated pump time,
"$P_t$" is the preset pump time, and
"F(P)" is a function relating pressure to the pump output.

Head space pressure and pump pressure are dynamic factors obtained using sensors. One or more of these factors may be used in the "Full Compensation" or "Product Level+Voltage+Temperature Compensation" protocols outlined in FIG. 3B, or combined with other factors for use in other compensation protocols as desired.

Pump type and the characteristics may affect the quantity of friction control media dispensed from the wayside delivery system 24 (Pump type compensation). For example, pumps inherently have properties that affect pump rates. The effect of the type of pump on the flow rate of the friction control media outputted from the wayside delivery system 24 onto the tracks may be compensated for by modifying the preset pump time of the pump 28 according to Equation 4 (Pump type compensation) below:

$$P_{tc}=P_t*PT \tag{Eq. 4};$$

where:
"$P_{tc}$" is compensated pump time,
"$P_t$" is the preset pump time, and
"PT" is a pump type scaling factor that is proportional to pump rate and determined through experimentation.

Pump type is a factors input by the user, and may be used in the "Full Compensation" or "Product Level+Voltage+Temperature Compensation" protocols outlined in FIG. 3B, or combined with other factors for use in other compensation protocols as desired.

Hose length, hose material, or both hose length and hose material may affect the length of time required to pressurize a hose 21 for transporting friction control media from the reservoir 26 to the delivery system 24 (Hose type compensation; Hose material compensation). For example, a longer hose will take more time to pressurize when compared to the length of time to pressurize a shorter hose. Similarly, a flexible hose material is not as efficient as transferring the pressure when compared to a hose made of more rigid material. Such effects on the length of time, hose material, or both, that are required to pressurize a hose 21 may affect the amount of friction control media that is ultimately dispensed onto a track. To compensate for variations in standard hose length and hose material, the preset pump time may be adjusted according to Equation 5 (Hose type/hose material compensation) below:

$$P_{tc}=P_t+c_0 \tag{Eq. 5};$$

where:
"$P_{tc}$" is compensated pump time,
"$P_t$" is the preset pump time, and
"$c_0$" is a coefficient determined through experimentation using standard length hoses.

Figure 4A:
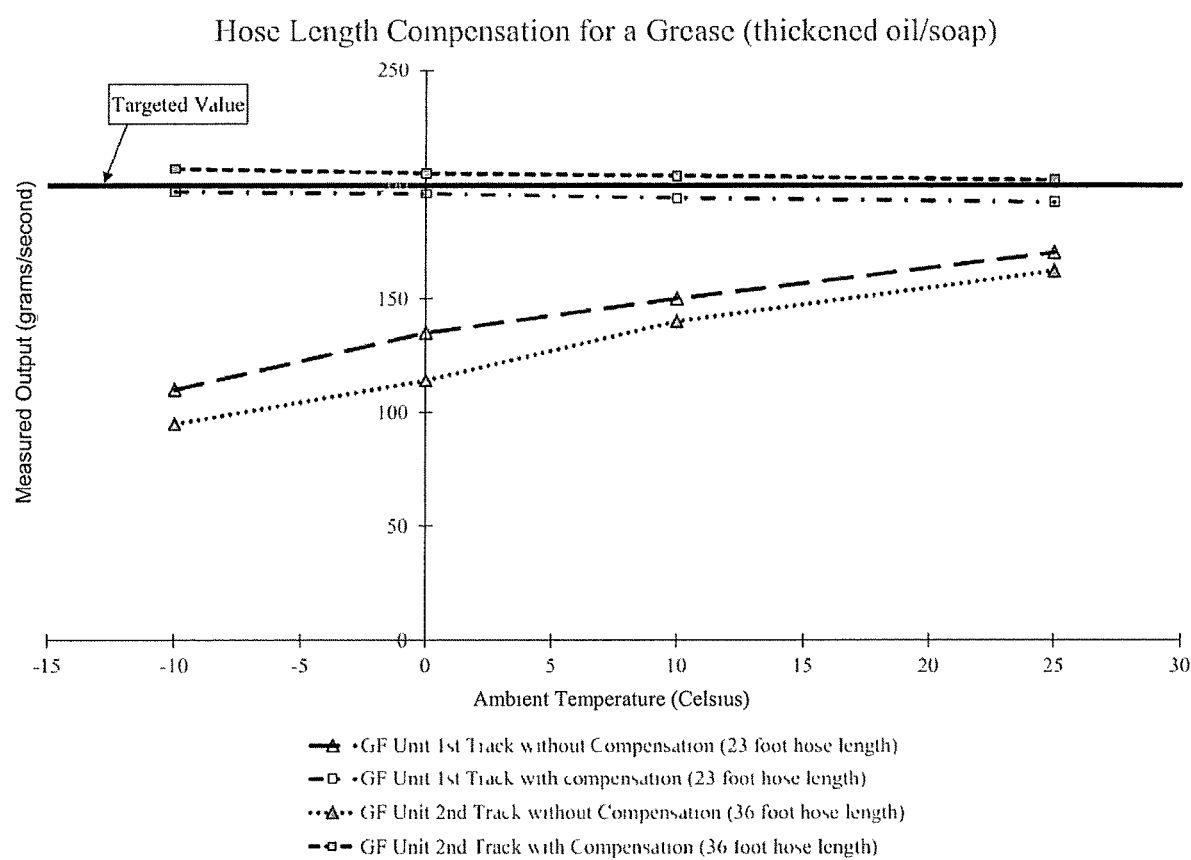
FIG. 4A shows a graph plotting the variability in grease output onto a track at various temperatures where the variability in hose length (e.g. 23 foot hose or a 36 foot hose) is uncompensated or compensated. Upper solid line 36 foot hose length, compensated output; upper dashed line 23 foot hose length, compensated output; Lower solid line 36 foot hose length, without compensated output; Lower dashed line 23 foot hose length, without compensated output; Upper solid line, spanning X axis: target value.
Figure 4B:
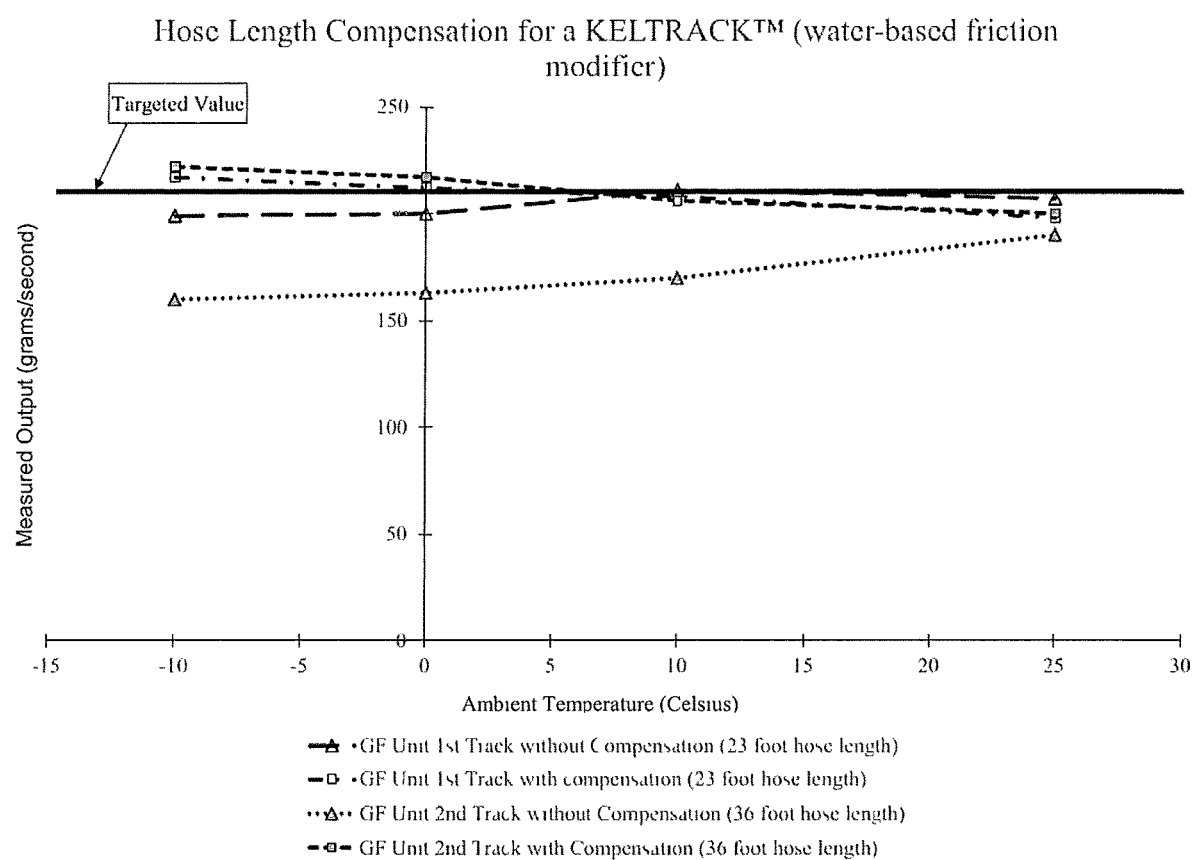
FIG. 4B shows a graph plotting the variability in Keltrack™ (a water-based friction modifier, as described in WO2002/26919) output onto a track at various temperatures where the variability in hose length (e.g. 23 foot hose or a 36 foot hose) is uncompensated or compensated. Upper solid line 36 foot hose length, compensated output; left hand side (LHS) upper dashed line 23 foot hose length, compensated output; lower solid line 36 foot hose length, without compensated output; LHS lower dashed line 23 foot hose length, without compensated output; Upper solid line, spanning X axis: target value.

Referring to FIGS. 4A and 4B, there is shown experimental data demonstrating that a change in hose length (e.g. a change from a 23 foot hose to a 36 foot hose) affects the output of friction modifying material (e.g. a grease FIG. 4A, or Keltrack™, a water-based friction modifier, as described in WO2002/26919, FIG. 4B) onto a track. As shown in FIGS. 4A and 4B, the longer an uncompensated hose length is, the less output there is per unit increase in temperature (e.g. over a range of −10° C. to 25° C.; compare lower solid and dashed lines in FIG. 4A). Furthermore, when the hose length has not been compensated for, the measured output increases with increasing temperature regardless of hose length (e.g. FIG. 4A). When the length has been compensated for, output of friction modifying material onto a track can be maintained around target output levels (FIGS. 4A and 4B).

For custom length hoses, the hose length is specified by the user and a correction factor is applied (Hose length compensation). The preset pump time may be adjusted to account for the pressure buildup required in the hose according to Equation 6 (Hose length compensation) below:

$$P_{tc}=P_t+c_1 L+c_0 \quad \text{(Eq. 6)};$$

where:
"$P_{tc}$" is compensated pump time,
"$P_t$" is the preset pump time,
"L" is hose length, and
"$c_1$" and "$c_0$" are coefficients determined through experimentation.

Hose type (hose material), hose length and custom hose length are factors input by the user, and one or more of these factors may be used in the "Full Compensation" or "Product Level+Voltage+Temperature Compensation" protocols outlined in FIG. 3B, or combined with other factors for use in other compensation protocols as desired.

Manufacturing variability in the hardware components, for example, the pump, motor, hoses, of the wayside delivery system 24 may also affect pump rates (Volumetric compensation). To account for such variability, the preset pump time may be linearly scaled to compensate for changes in pump rate, according to Equation 7 (Volumetric compensation) below:

$$P_{tc}=P_t * W_{theo}/W_{meas} \quad \text{(Eq. 7)};$$

where:
"$P_{tc}$" is compensated pump time,
"$P_t$" is the preset pump time,
"$W_{theo}$" is theoretical friction control media output, and
"$W_{meas}$" is measured friction control media output.

Pump types, pump motors, hose types are factors input by the user, and one or more of these factors may be used in the "Full Compensation" or "Product Level+Voltage+Temperature Compensation" protocols outlined in FIG. 3B, or combined with other factors for use in other compensation protocols as desired.

Different types of a wayside bar, used to deliver the friction control media onto the track, may also affect the rate of delivery of the media (Bar type compensation). The geometry of different types of wayside bar may provide a different resistance to flow of the media and result in different output rates. Depending on the bar type specified by the user, the pump time is linearly scaled to account for the flow rate of the given bar using Equation 8 (Bar type compensation):

$$P_{tc}=P_t * BT \quad \text{(Eq. 8)}$$

where:
$P_{tc}$ is Compensated Pump Time
$P_t$ is Pump Time
BT is a Bar type scaling factor which is determined experimentally.

Bar type is a factor input by the user, and may be used with any of the compensation protocols outlined in FIG. 3B, or combined with other factors for use in other compensation protocols as desired.

The data obtained from one or more data collection module 29 may be compared with the base-line reference values. Base-line reference values further include, but are not limited to, initial settings 10, information of the track 50, 60, or a combination thereof, stored on a database of the remote performance unit 70. For example, the base-line reference values may further include track maintenance conditions, time since the last train pass, number of wheels passing the one or more than one wayside devices 22, intentional system shutdown conditions due to known track maintenance work such as track grinding, tie removal, tie replacement, fixed inputs including, but not limited to, the family or inherent characteristics of the friction control media, pump type, hose length, hose type, tank type, and volumetric calibration inputs, bar type, or a combination thereof. The base-line reference data may be factored in to determine whether an adjustment of a delivery system 24 of the one or more wayside device 22 is required to dispense an appropriate quantity of friction control media onto the tracks 12 to achieve, or maintain, an appropriate co-efficient of friction between the rail track and the wheels of the train. If changes in friction control system application settings are determined to be required, then they are transmitted 80 to the friction management application system 20 comprising one or more wayside device 22.

Figure 5:
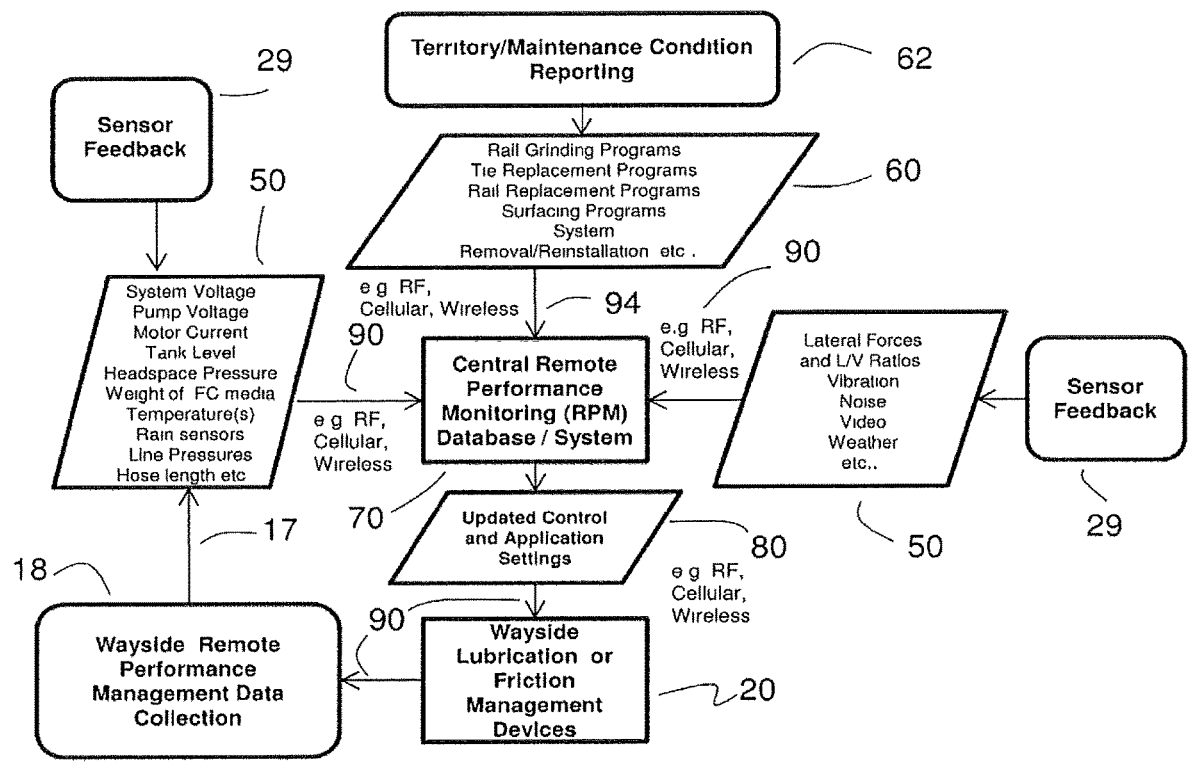
FIG. 5 shows data inputs from territory/maintenance conditions, sensors within data collection modules, and wayside device status that may be received and analyzed by a remote performance monitoring unit.

FIG. 5 shows non-limiting examples of data inputs that may be analyzed by the remote performance unit 70 (also referred to as the central remote performance monitoring database/system) so that friction control media application settings within the friction management application system 20 or the Wayside Lubrication or Friction Management Devices (delivery system) 24 may be adjusted as described herein. These inputs include:

(i) territory maintenance conditions 62 (for example, maintenance data 60 regarding rail grinding programs, tie replacement programs, rail replacement programs, surfacing programs, system removal/reinstallation, and other maintenance procedures that may take place within a rail system);

(ii) sensor feedback (via data collection modules) 29 including, but not limited to, data 50 regarding environmental conditions, ambient temperature, rain, humidity and wetness of the track, and track conditions for example, lateral force, LN ratios, vibration, noise, video, time since the last train pass, and number of wheels passing the one or more than one wayside devices 22; and (iii) sensor feedback (via data collection modules) 29 and status of wayside device 22 including, but not limited to, data 50 regarding internal voltage measurements of the wayside delivery system 24, tank (reservoir) type, tank level, tank temperature, headspace pressure within the reservoir, battery voltage, motor current, line or hose pressure, line or hose length, line or hose material, line or hose temperature, pump type, inherent characteristics of the pump, pump input pressure, pump output pressure, change in the speed of rotation of the pump gear wheel, internal voltage of the pump, the time pump is delivering friction control media, the amount, volume or weight of friction control media output, information related to the inherent characteristics of the friction control media.

Some of these data may be directly transmitted to a processor for further analysis, for example, the remote performance unit 70, or transmitted to the remote performance unit 70 via the data control module (29; see FIG. 1B), using wireless or cabled communications (90, 94), where the data is processed. Some of these data, for example, but not limited to, data related to type of friction control media (product family), pump characteristics (pump type), hose characteristics (hose type, hose length), volumetric calibration, bar type, and tank characteristics, are inputted into the database stored on the remote performance unit 70, thereby forming a part of the initial settings 10.

As required from time to time, updated adjustments to control and application settings 80 may be transmitted to the friction management application system 20 comprising one or more than one wayside device 22. Status of the friction management device 20 and wayside remote performance data may be collected, and such data may be accessed by the remote performance unit 70, along with data regarding the status of the wayside device 22 (e.g. tank level, system voltage, motor current, line/hose pressures and temperature, etc.) for inclusion within the analysis by the remote performance unit 70.

Data (e.g. internal voltage measurements of the wayside delivery system 24, wetness of the track, ambient temperature, head space pressure in the reservoir) is collected from sensors (e.g. via data communication modules 29), and analyzed against reference values stored on a processor, for example the remote performance unit 70, to determine if there are variations between the one or more collected data and corresponding one or more reference values. If there are differences then the processor, or remote performance unit 70, determines whether the differences need to be compensated for in terms of modifying the settings of the corresponding wayside device and adjust the pump time (e.g. FIG. 3B) under which friction control media is dispensed onto the track 12. For example, if the variations or differences between the collected data and stored data exceed a preset threshold value stored within the processor, then the pump time is compensated accordingly. Based on these analysis, and as required, revised application settings may be deployed to one or more than one wayside device 22 of the target friction management application system 20, for example, to increase or decrease the amount or location (TOR or gauge face) of friction control media to be dispensed to the track 12 to achieve, or maintain, an appropriate co-efficient of friction between the rail track and the wheels of the train.

By measuring data obtained at one or more data collection location, a change in a measured parameter, for example but not limited to changes in internal voltage of the wayside delivery system 24, ambient temperature and/or other parameters as described herein, may elicit a corresponding signal to be transmitted to the one or more wayside device to modify the friction control media output onto the track 12. For example, which is not to be considered limiting, a change in the internal voltage of the wayside delivery system 24, if unaccounted for, that would otherwise lead to a dispensation of friction control media at a quantity that is up to 10 fold below or above a target dispensation level (i.e. a preset threshold value), or an increase or decrease of from about 1, 5, 10, 15, 20, 30, 40, 50, 60, 70, 80, 90, 100, 200, 300, 400, 500%, or any amount therebetween, of the target dispensation level (preset threshold value), may elicit a signal that is transmitted to the one or more wayside device 22 at the data collection location to adjust the pump time in order to control the quantity of friction control media dispensed onto the track 12.

If there is no observed change of any one of the measured or inputted variables, when compared to the reference values, then no change to a setting of friction control media application (e.g. no change to the pump time) is transmitted to the one or more wayside device 22.

Data may be transmitted from a data communication module via a remote control module (RCM) to a remote performance monitoring database or data processing unit 70, via a communication (GPRS) tower (see for example FIG. 9 of WO 2011/143765; which is incorporated herein by reference). The wayside friction management system 1 may further comprising a mobile remote performance monitoring interrogator system that receives a communication from the RCM and transmits the communication to the GPRS tower (see for example FIG. 10 of WO 2011/143765; which is incorporated herein by reference).

Self-contained data collection modules, sensors, and other measurement devices as described above, may be deployed in a geographical territory, recording data parameters such as those described above, in key locations. Collected data such as ambient temperatures and delivery system voltage measurements etc., are transmitted through radio frequency, cellular communications channels, or by cable, and collected centrally in the databases of the remote performance unit 70. The remote performance unit 70 analyzes incoming data comprising wayside delivery system 22 voltage measurements and compares the incoming data with baseline reference values comprising historical or pre-inputted reference voltage values and corresponding unadjusted friction control media output quantities. Speed data may also analyzed, with filtering used to exclude data from trains operating at speeds significantly below or above the normal distribution of speeds at each measurement location.

The result of wayside delivery system 24 voltage measurement analysis, by itself or in combination with other variables or parameters described herein including, but not limited to, known territory and maintenance conditions 60 (for example as described in WO 2011/143765), ambient conditions, friction control media levels in the reservoir 26, information related to the friction control media, hose type, hose length, pump type, tank type, and calibration output, may result in automatic adjustments 80 to application rates. Having evaluated the collected data, the remote performance monitoring unit 70 can use a high level decision making approach to determine whether an automatic adjustment of applicator systems is needed to dispense an appropriate quantity of friction control media onto the track 12 to achieve, or maintain, an appropriate co-efficient of friction between the rail track and the wheels of the train.

Automatic changes in friction control system application settings are transmitted by the remote performance monitoring unit 70 to the friction management application systems 20 through radio frequency, cellular communication channels, or by cable.

The wayside friction management system described herein may use liquid or paste-like friction control media. Any liquid composition that can be pumped from the reservoir to a nozzle may be applied using the system of the present invention as would be readily determined by one of skill in the art. Non-limiting examples of liquid compositions that may be applied include but are not limited to those described in U.S. Pat. Nos. 6,135,767; 6,387,854; 5,492,642; US 2004 0038 831 A1; WO 02/26919 (US 2003 0 195 123 A1); WO 98/13445; CA 2,321,507; EP 1 357 175; EP 1 418 222; U.S. Pat. Nos. 6,795,372; 7,244,695; 7,357,427.

All citations herein are hereby incorporated by reference.

The present invention has been described with regard to one or more embodiments the scope of the claims should not be limited by the preferred embodiments set forth in the examples, but should be given the broadest interpretation consistent with the description as a whole.

What is claimed is:

1. A wayside friction management system comprising:
   (a) one or more wayside device for mounting on a track of a rail system and for applying a friction control media to the track, the one or more wayside device comprising a delivery system connected via a hose to a reservoir containing the friction control media, the delivery system for dispensing the friction control media to one or both rails of the track via a pump;

(b) one or more data collection module in operative communication with the delivery system, one or more data collection sensors, or a combination thereof;

(c) a remote performance unit (RPU); and (d) a power source operatively connected to one or more components of the wayside friction management system;

the one or more data collection module configured to collect data and transmit the data to the RPU, the data comprising real time measurements of an internal voltage of the delivery system, the pump, or a combination thereof;

the RPU comprising reference values stored on a database thereon, the reference values comprising one or more reference voltage values, the RPU configured to compare the data to the reference values, wherein at least the real time measurements of the internal voltage are compared to at least the one or more reference voltage values, and depending on a difference between the data and the reference values, a friction control media delivery time, rate, or both time and rate of the pump is modified to achieve a desired quantity of the friction control media on the track.

2. The wayside friction management system of claim 1, the one or more reference voltage values further comprising historical measurements of the internal voltage of the delivery system corresponding to associated and known friction control media output quantities.

3. The wayside friction management system of claim 1, the one or more reference voltage values further comprising preset voltage values that are input or selected by a user or an operator of the wayside friction management system, the preset voltage values corresponding to associated and known friction control media output quantities.

4. The wayside friction management system of claim 1, the data collected by the one or more data collection module further comprising measurements of ambient temperature, wetness of the track, head space pressure of the reservoir, reservoir tank level, pump input pressure, pump output pressure, pump motor current, fluctuations in the internal voltage of the wayside delivery system, fluctuations in the internal voltage of the pump, time pump is delivering friction control media, delivery hose pressure, delivery hose temperature, battery voltage, ambient temperature and humidity, precipitation, wind, wetness of the track, time since last train pass, number of axles or wheels passing the one or more wayside device, data collected from a video unit, data collected from a photo capture unit, data collected from an acoustic feedback unit, data collected from a vibration detection unit, data collected from a speed detection unit, data collected from a strain gauge, and data collected from an accelerometer, or a combination thereof.

5. The wayside friction management system of claim 1, the reference voltage values further comprising initial settings that are inputted or selected into the database by a user or operator of the wayside friction management system, the initial settings comprising type of friction control media being delivered, physical characteristics of the friction control media, physical characteristics of the hose, characteristics related to manufacturing variability in the pump, speed of pump gear rotation, characteristics related to manufacturing variability in the hose, physical characteristics of the reservoir, or any combination thereof.

6. The wayside friction management system of claim 5, the physical characteristics of the hose comprising at least one of hose material and hose length.

7. The wayside friction management system of claim 1, comprising a plurality of the one or more wayside device distributed over a designated geographical territory, the RPU configured to receive the data from each of the one or more data collection modules distributed within the designated geographical territory.

8. The wayside friction management system of claim 7, further comprising a plurality of the designated geographical territories, each of the designated geographical territories comprising one or more of the one or more wayside device.

9. The wayside friction management system of claim 1, each of the one or more wayside device further comprising a receiver configured to receive instructions from the RPU, and convey the instructions to the delivery system.

10. A method of controlling friction control media output of the wayside friction management system of claim 1, the method comprising:

i) collecting the data;

ii) transmitting the data by radio frequency, cellular communications channels, or both, from the one or more wayside device to the remote performance unit;

iii) comparing the data with the reference values; and iv) depending on a difference between the data and the reference values, modifying the friction control media delivery time, rate, or both time and rate of the pump in order to achieve a desired quantity of the friction control media to the track.

11. The wayside friction management system of claim 1, wherein the data collected by the one or more data collection module further comprising real time measurements of time since last train pass, axle or wheel pass number, or both the time since last train pass and the axle or wheel pass number, and the RPU comprising reference values stored on a database thereon, the reference values comprising one or more reference values of the time since last train pass, the axle or the wheel pass number, or both, the RPU configured to compare the data to the reference values, wherein at least the real time measurements of time since the last train pass, the axle or the wheel pass number or both, are compared to at least the one or more reference time since the last train pass, the axle or the wheel pass number, or both, and depending on a difference between the data and the reference values, a friction control media delivery time, rate, or both time and rate of the pump is modified to achieve a desired quantity of the friction control media on the track.

12. A remote performance unit (RPU) configured to receive data from one or more wayside devices, the data comprising real time measurements of an internal voltage of a wayside delivery system, a pump, or a combination thereof, the RPU comprising reference values stored on a database thereon, the reference values comprising one or more reference voltage values, the RPU configured to compare the data to the reference values, wherein at least the real time measurements of the internal voltage are compared to at least the one or more reference voltage values, and depending on a difference between the data and the reference values, a friction control media delivery time, rate, or both time and rate of the pump is modified to achieve a desired quantity of the friction control media on a track.

13. The remote performance unit of claim 12, further comprising one or more software algorithms for analyzing the data and providing an output of track performance, track status, status of the one or more wayside devices, information of an environment of the track, information of a train, or a combination thereof.

14. The remote performance unit of claim 12, the data further comprising measurements of ambient temperature, wetness of the track, head space pressure of the reservoir, reservoir tank level, pump input pressure, pump output pressure, pump motor current, fluctuations in the internal voltage of the wayside delivery system, fluctuations in the internal voltage of the pump, time pump is delivering friction control media, delivery hose pressure, delivery hose temperature, battery voltage, ambient temperature and humidity, precipitation, wind, wetness of the track, time since last train pass, number of axles or wheels passing the one or more wayside devices, data collected from a video unit, data collected from a photo capture unit, data collected from an acoustic feedback unit, data collected from a vibration detection unit, data collected from a speed detection unit, data collected from a strain gauge, and data collected from an accelerometer, or a combination thereof.

15. The remote performance unit of claim 12, the reference values further comprising initial settings that are inputted into the database by a user or operator of the wayside delivery system, the initial settings comprising type of friction control media being delivered, physical characteristics of the friction control media, physical characteristics of the hose, characteristics related to manufacturing variability in the pump, speed of pump gear rotation, characteristics related to manufacturing variability in the hose, physical characteristics of the reservoir, or any combination thereof.

16. The remote performance unit of claim 12, further comprising a transmitter to convey instructions by radio frequency, cellular communication channels, or both, to a receiver in communication with the one or more wayside devices.

* * * * *